(12) United States Patent
dela Cruz

(10) Patent No.: US 7,544,263 B2
(45) Date of Patent: Jun. 9, 2009

(54) METHOD OF FORMING FOLDED-STACK PACKAGED DEVICE USING VERTICAL PROGRESSION FOLDING TOOL

(75) Inventor: Ernesto S. dela Cruz, Laguna (PH)

(73) Assignee: Intel Corporation, Santa Clara, CA (US)

( * ) Notice: Subject to any disclaimer, the term of this patent is extended or adjusted under 35 U.S.C. 154(b) by 424 days.

(21) Appl. No.: 11/297,073

(22) Filed: Dec. 8, 2005

(65) Prior Publication Data

US 2006/0086453 A1   Apr. 27, 2006

Related U.S. Application Data

(62) Division of application No. 10/192,293, filed on Jul. 8, 2002, now Pat. No. 7,017,638.

(51) Int. Cl.
H01L 23/48 (2006.01)
B32B 37/00 (2006.01)

(52) U.S. Cl. ........................ 156/226; 156/227

(58) Field of Classification Search ............... None
See application file for complete search history.

(56) References Cited

U.S. PATENT DOCUMENTS

| 3,418,785 | A | * | 12/1968 | Duryee ..................... 53/557 |
| 3,866,393 | A | * | 2/1975 | Warner et al. .............. 53/574 |
| 5,776,797 | A | * | 7/1998 | Nicewarner, Jr. et al. ... 438/107 |
| 5,894,710 | A | * | 4/1999 | Balder ...................... 53/398 |

* cited by examiner

Primary Examiner—Richard Crispino
Assistant Examiner—Barbara J. Musser
(74) Attorney, Agent, or Firm—Blakely, Sokoloff, Taylor & Zafman LLP

(57) ABSTRACT

An embodiment of the present invention includes a pusher and a horizontal puncher. The pusher is located underneath a strip of flexible tape attached to a first unit and a sub-assembly, respectively. The pusher pushes the first unit upward vertically. The horizontal puncher punches the first unit horizontally so that the first unit is folded on top of the sub-assembly.

14 Claims, 8 Drawing Sheets

METHOD OF FORMING FOLDED-STACK PACKAGED DEVICE USING VERTICAL PROGRESSION FOLDING TOOL

CROSS-REFERENCES TO RELATED APPLICATIONS

This is a Divisional Application of U.S. patent application Ser. No. 10/192,293, filed Jul. 8, 2002 now U.S. Pat. No. 7,017,638. This Divisional Application claims the benefit of the U.S. patent application Ser. No. 10/192,293.

BACKGROUND

1. Field

Embodiments of the invention relate to the field of packaging, and more specifically, to folded-stack packaging.

2. Background

Chip scale technology offers many advantages in electronics packaging. One emerging packaging technique in chip scale technology is micro ball grid array (µBGA) packaging. µBGA provides the smallest size, highest performance, and best reliability of currently available packages. Folded-stack µBGA further improves board density and reliability.

Existing techniques for folded-stack µBGA are typically manual, requiring boat-to-boat handling from singulation process to cure process. These techniques have a number of drawbacks. First, the process is slow and cumbersome. The µBGA units are processed through a number of discrete steps: saw singulation, first boat handling, folding and adhere, second boat handling, folding and curing, and then traying. Second, it is expensive because several components (e.g., jigs) are needed.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes a pusher and a horizontal puncher. The pusher is located underneath a strip of flexible tape attached to a first unit and a sub-assembly, respectively. The first unit is punched out of the strip. The pusher pushes the first unit upward vertically. The horizontal puncher punches the first unit horizontally so that the first unit is folded on top of the second unit.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, etc.

Figure 1:
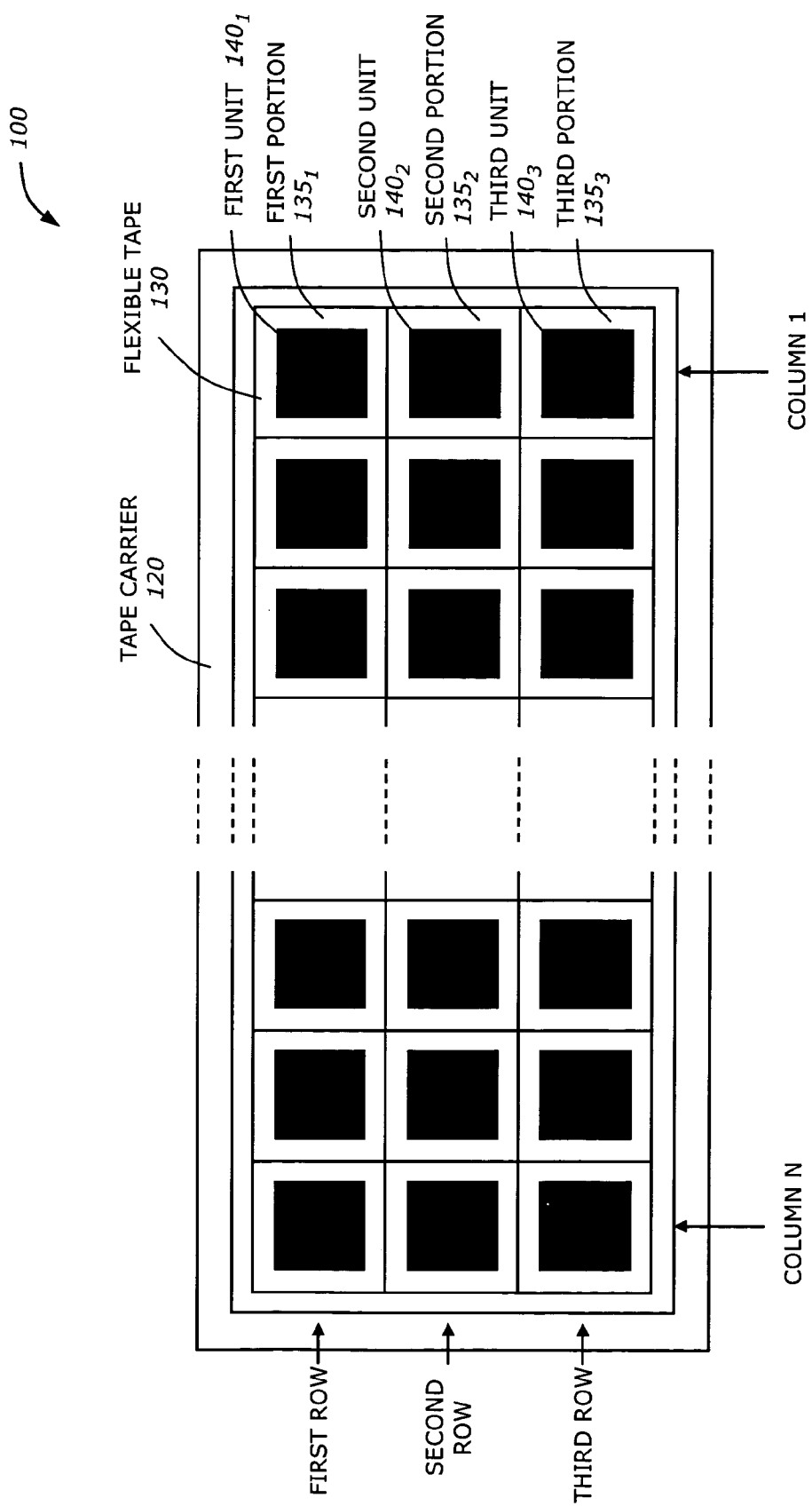
FIG. 1 is a diagram illustrating a micro ball grid array (µBGA) packaging layout according one embodiment of the invention.

FIG. 1 is a diagram illustrating a micro ball grid array (µBGA) packaging layout 100 according to one embodiment of the invention. The layout 100 includes a tape carrier 120, and a flexible tape 130.

The tape carrier 120 is typically a metal frame to carry a number of packaged devices affixed on the flexible tape 130. The flexible tape 130 is a rectangular tape that can be flexibly folded. The flexible tape 130 may be a double-sided polyimide tape (e.g., Kapton or Upilex) having a thickness of about 10 µm to 75 µm. The packaged devices are affixed on the flexible tape 130 in a number of rows and columns. In one embodiment, there are three rows and N columns. Typically values of N are 16, 20, 24, 32, etc.

Each column corresponds to a strip of the flexible tape 130 and includes three units: the first unit 1401, the second unit 1402, and the third unit 1403. Each of the units includes a die affixed to a corresponding portion of the flexible tape 130. For example, the first unit 1401, the second unit 1402, and the third unit 1403 include a first die, a second die, and a third die, respectively, affixed to a first portion 1351, a second portion 1352, and a third portion 1353, respectively, of the strip. Each side of the flexible tape 130 may have a metal layer that has leads and/or interconnections between the die. The die may be any semiconductor chip or devices such as memory device, flash memory, static random access memory (SRAM), dynamic random access memory (DRAM), logic devices, processing elements, etc. The die are affixed to the flexible tape 130 with die-attaching materials based on silicon or epoxy. The die may also be lead-bonded and encapsulated. The die are attached to the strip by solder balls.

The packaged devices on the flexible tape 130 are packaged and processed according to traditional packaging techniques. In one embodiment, the packaging technique is the µBGA. The packaged devices on each strip or column are folded in a stacking manner to form a folded-stack µBGA.

Figure 2:
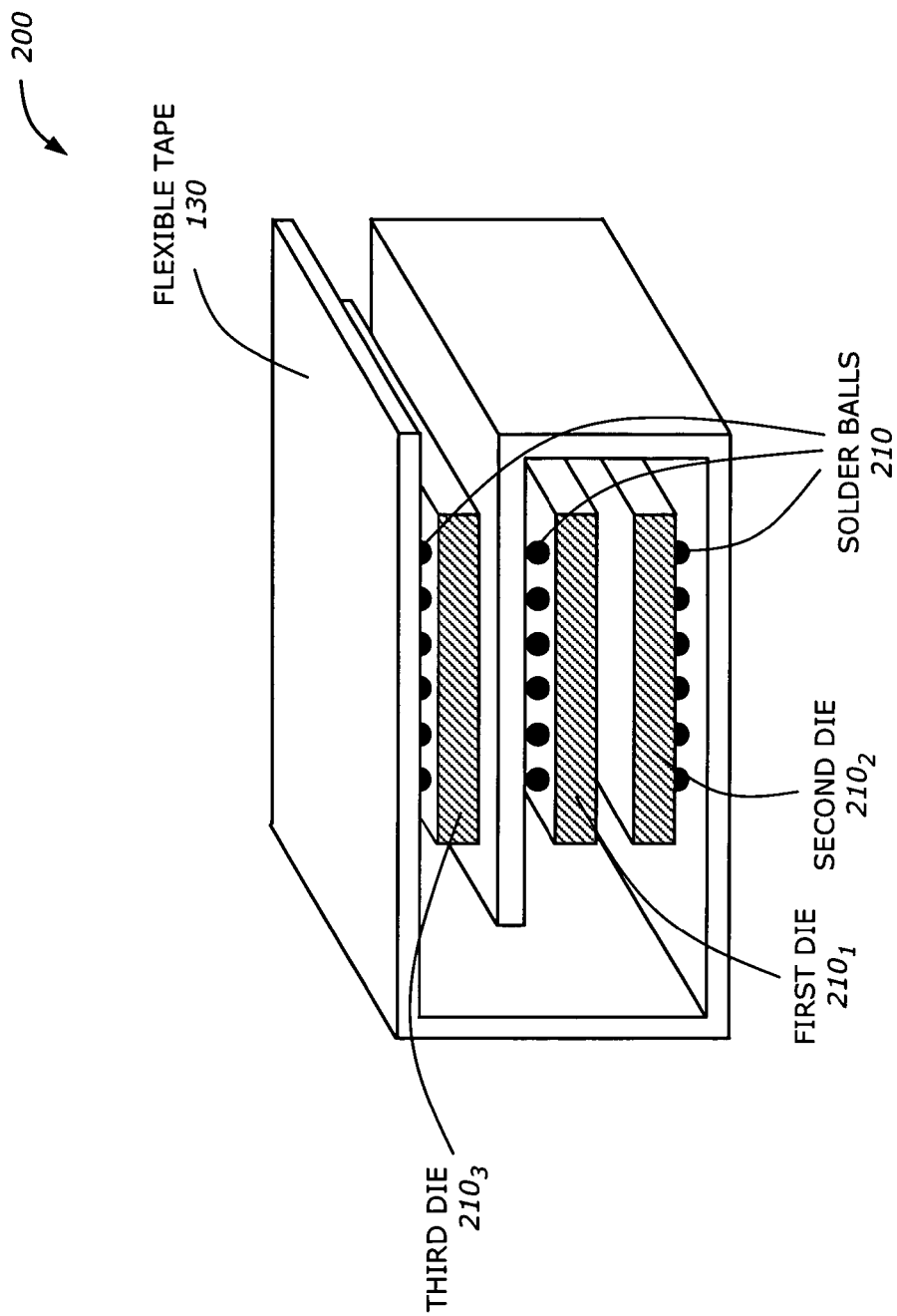
FIG. 2 is a diagram illustrating a folded-stack µBGA packaged device according to one embodiment of the invention.

FIG. 2 is a diagram illustrating a folded-stack µBGA packaged device 200 according to one embodiment of the invention.

The folded-stack device 200 includes first, second, and third die 2101, 2102, and 2103, respectively, and the flexible tape 130. As discussed above, the first, second, and third die 2101, 2102, and 2103 are attached to the flexible tape 130 via solder balls 210. The solder balls 210 are micro grid array of soldering materials attached to the pads on the flexible tape 130. The flexible tape 130 is folded in two folds. In the first fold, the first die 210, is positioned such that its surface is affixed to the surface of the second die 2102 by an adhesive. The affixed first and second die 2101 and 2102 form a partially folded unit. In the second fold, the third portion of the flexible tape 130 attaching to the third die 2103 is folded on top of the partially folded unit. The surface of the third die 2103 is affixed to the bottom side of the first portion of the flexible tape 130 by adhesive.

The folded-stack µBGA packaged device 200 as formed is compact and provides high density and high reliability on a printed circuit board. The process to fold the µBGA packaged device 200 is performed in a progressive manner in an assembly line that may include several stations. The folding process is efficiently performed by using a tool assembly for folding, affixing, and curing.

Figure 3:
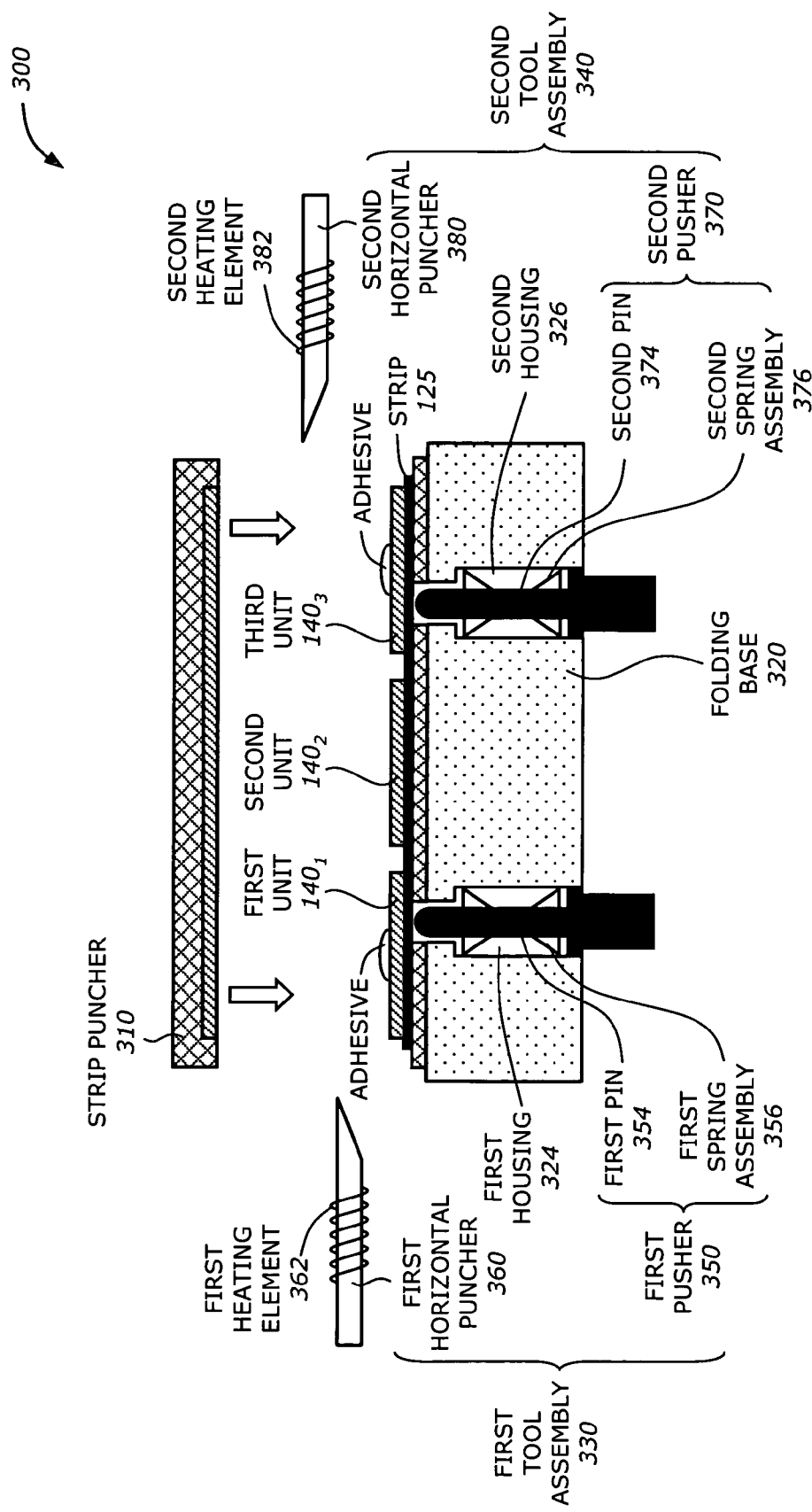
FIG. 3 is a diagram illustrating a tool system according to one embodiment of the invention.

FIG. 3 is a diagram illustrating a tool system 300 according to one embodiment of the invention. The system 300 includes a strip puncher 310, a folding base 320, a first tool assembly 330 and a second tool assembly 340.

The strip puncher 310 punches a strip 125 out of the flexible tape 130. The strip 125 has first, second, and third units 1401, 1402, and 1403. The strip puncher 310 punches vertically from the top down. The punched strip 125 is placed on the folding base 320. Adhesive is applied to the surface of the first and third units 1401 and 1403 so that they are attached when folded together. The application of adhesive may take place before or after the vertical punching. Adhesive is dispensed on the surface by any suitable method.

The folding base 320 provides support for the strip 125. The folding base 320 has a first housing 324 and a second housing 326. The first and second housings 324 and 326 are located underneath the first and third units 1401 and 1403, respectively, to house first and second pushers 350 and 370. Each of the first and second housings 324 and 326 has an opening at the top to allow the corresponding pusher to move upward to push the corresponding unit upward in a substantially vertical direction.

The first tool assembly 330 includes the first pusher 350 and a first horizontal puncher 360. The first pusher 350 and the first horizontal puncher 360 may be separate or mechanically linked to operate in a lockstep fashion. The first tool assembly 330 folds the first unit 1401 on top of the second unit 1402. The first pusher 350 is located in the first housing 324 underneath the first unit 1401. The first pusher 350 includes a first pin 354 and a first spring assembly 356. The first pin 350 ejects or moves from a first position to a second position upon being activated by an activating mechanism. When the first pin 350 moves upward through the opening of the first housing 324, it pushes the first unit 1401 upward vertically. The first spring assembly 356 is attached to the first pin 350 to exert a spring action to the first pin 350 so that the first pin 350 returns to the first position from the second position when the activating mechanism is de-activated or when the activating force is removed. The first horizontal puncher 360 punches the first unit 1401 horizontally when it is pushed upward so that it is folded on top of the second unit 1402. In addition to delivering the horizontal punch, the first horizontal puncher 360 also cures the adhesive by dissipating heat at the tip or the distal end. The first horizontal puncher 360 is typically made of strong material with high thermal conductivity such as metal. It may be launched by a launcher (not shown) with a spring or spring-like action so that it can be retracted after adhesive curing. The first horizontal puncher 360 includes a heating element 362 to heat its tip or distal end. The heating element 362 may be any suitable heating element such as a resistor coiled around the puncher.

The second tool assembly 340 is essentially the same as the first tool assembly 330. It includes the second pusher 370 and a second horizontal puncher 380. The second pusher 370 and the second horizontal puncher 380 are similar to the first pusher 350 and the first horizontal puncher 360, respectively, except that the second horizontal puncher 380 may be located at a higher level than the first horizontal puncher 360 to match the total thickness of the three units stacking on one another. This would help the puncher 360 to deliver a more effective punch to the third unit 1403 and exert a sufficient force or pressure on the folded unit. The second tool assembly 340 folds the third unit 1403 on top of the partially folded unit formed by the folded first and second units 1401 and 1402.

The tool assemblies 330 and 340 perform folding, affixing, and curing in an efficient manner. They can be used in a single station in an assembly line process to form folded stack packaged devices. Although the above description is for a three-unit packaged device, the technique can be extended for more than three units. For example, a four-unit packaged device may need three pushers and two horizontal punchers. A first pusher folds the first unit on top of the second unit to form a sub-assembly or a first partially folded unit using a first horizontal puncher. A second pusher folds the fourth unit on top of the third unit to form a second partially folded unit using a second horizontal puncher. A third pusher folds the second partially folded unit on top of the first partially folded unit using the second horizontal puncher. For a three-unit folded stack packaged device, the process may include four phases.

Figure 4A:
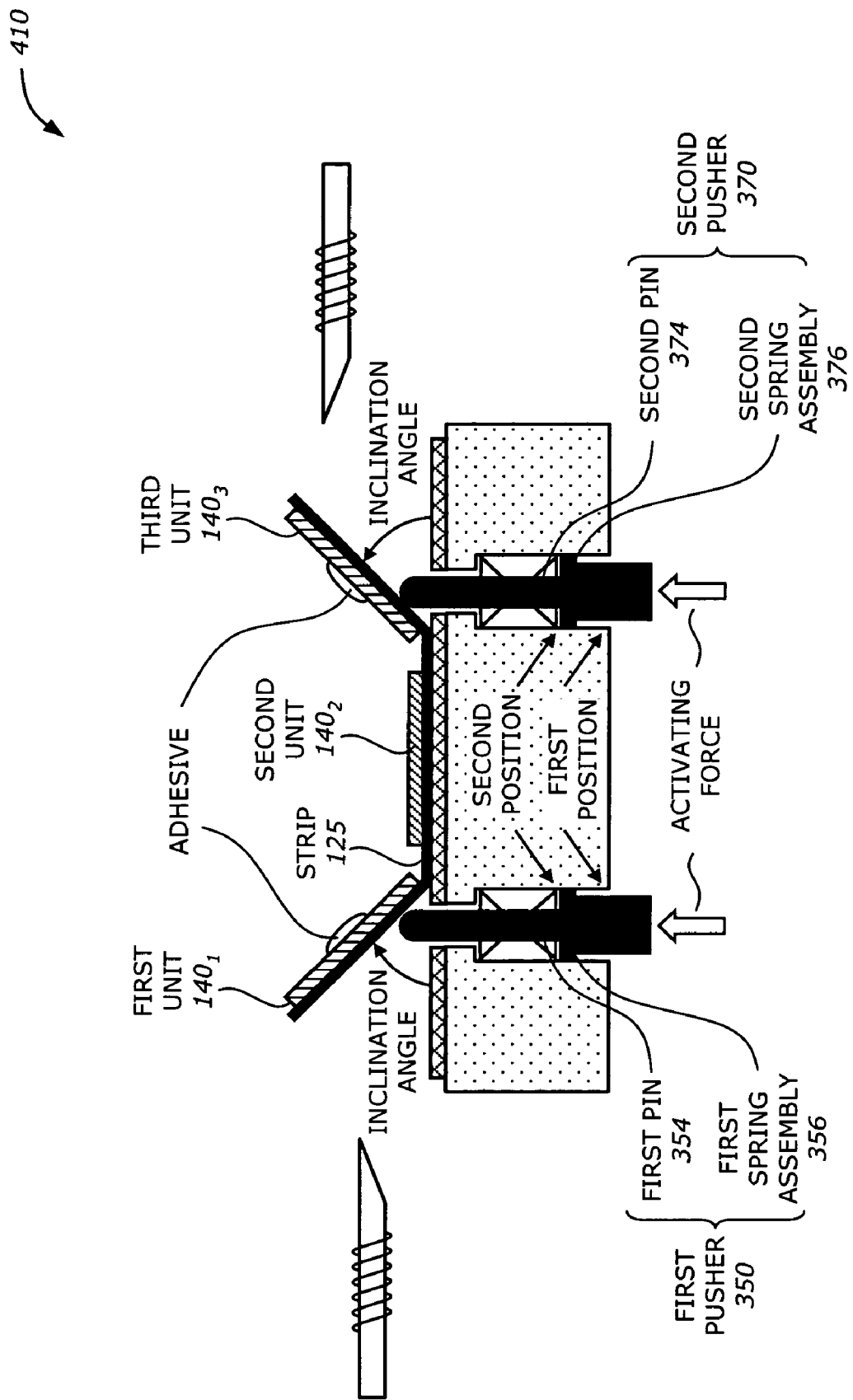
FIG. 4A is a diagram illustrating a first phase of the folding process according to one embodiment of the invention.

FIG. 4A is a diagram illustrating a first phase 410 of the folding process according to one embodiment of the invention.

In the first phase 410, an activating force from an activation mechanism is applied to the first and second pins 354 and 356 so that they move from a first position to a second position. As the pins 354 and 374 move to the second position through the opening, the first and third units 1401 and 1403 are pushed upward vertically, forming an inclination angle or slope with respect to the surface of the folding base 320. To have effective punching, the inclination angle may range from 30° to 70°. When the pins 354 and 374 reach the second position, the first and third units 1401 and 1403 are pushed to form a slope sufficiently steep to allow the first and second punchers 360 and 380 to make proper impact when punching. In addition, as the pins 354 and 374 move to the second position under the activation force, the corresponding spring assemblies 356 and 376 are compressed.

The two horizontal punchers 360 and 380 are prepared to launch the punch. The heating elements 362 and 382 are activated to heat up the tip or the distal end of the corresponding punchers 360 and 380. This can be accomplished by applying a voltage across the heating elements 362 and 382.

Figure 4B:
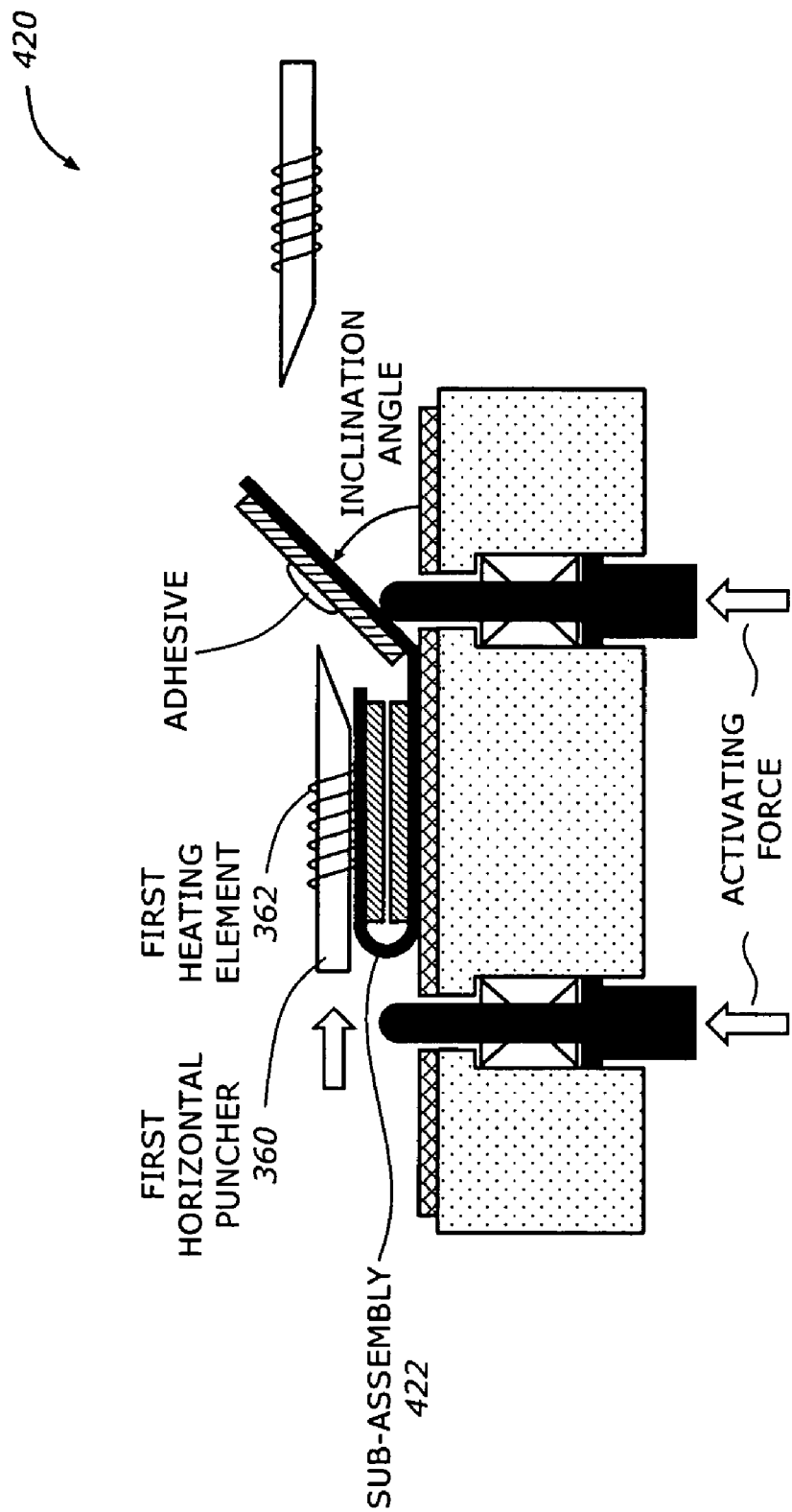
FIG. 4B is a diagram illustrating a second phase of the folding process according to one embodiment of the invention.

FIG. 4B is a diagram illustrating a second phase 420 of the folding process according to one embodiment of the invention.

In the second phase 420, the first horizontal puncher 360 is activated to slide or move toward the first unit 1401 in a substantially horizontal direction. The first horizontal puncher 360 impacts the first unit 1401 and cause the first unit 1401 to fold on top of the second unit 1402 to form a sub-assembly or a partially folded unit 422. The first horizontal puncher 360 continues to slide horizontally on top of the folded first unit on the side of the strip of tape. It is stopped when it reached a predetermined location, usually when it sufficiently covers the surface of the folded first unit. Since the first horizontal puncher 360 is at a horizontal level that is approximately equal to the thickness of the first and second units 1401 and 1402 when they are folded together, it fits on top of the first unit 1401. The first horizontal puncher 360 may be firmly guided so that it can exert a suitable force on the folded first unit 1401 to affix it on top of the second unit 1402 via the adhesive. The first horizontal puncher 360 stays on top of the partially folded unit 422 so that its heated tip or distal end cures the adhesive.

Figure 4C:
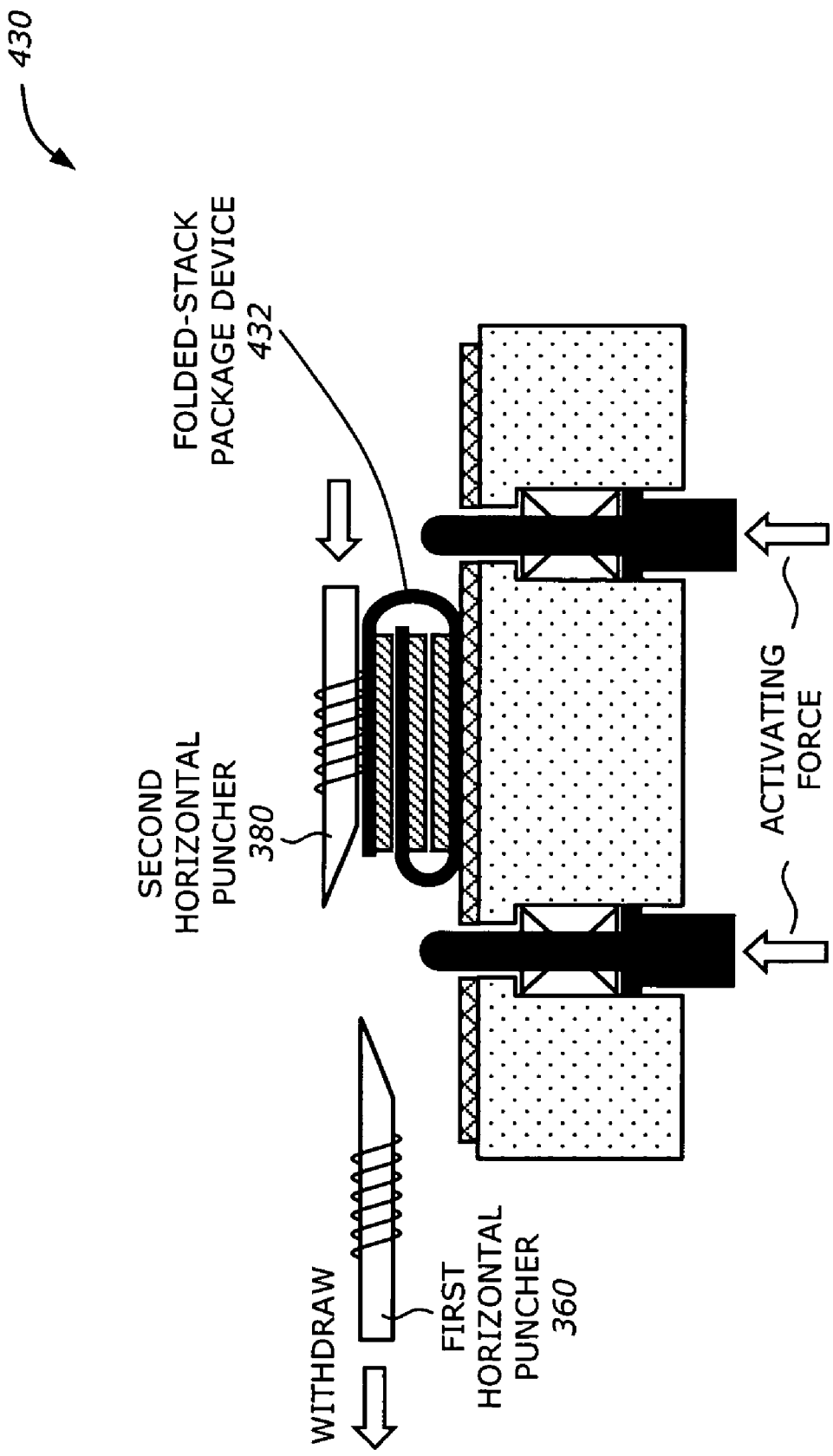
FIG. 4C is a diagram illustrating a third phase of the folding process according to one embodiment of the invention.

FIG. 4C is a diagram illustrating a third phase 430 of the folding process according to one embodiment of the invention.

In the third phase 430, the first horizontal puncher 360 finishes curing the adhesive and the partially folded unit 422.

It is then retracted horizontally to its original position. The second horizontal puncher 380 is then activated to impact the third unit 1403 horizontally to fold the third unit 1403 on top of the partially folded unit 422 to form a folded stack packed device 432. The second horizontal puncher 360 continues to slide horizontally on top of the partially folded unit 422 on the side of the strip of tape. Since the second horizontal puncher 380 is at a horizontal level that is approximately equal to the thickness of the third unit 1403 and the partially folded unit 422 when they are folded together, it fits on top of the third unit 1403 and exerts a force on the third unit 1403 to affix it to the partially folded unit 422 via the adhesive. The second horizontal puncher 380 stays on top of the partially folded unit 422 so that its heated tip or distal end cures the adhesive.

Figure 4D:
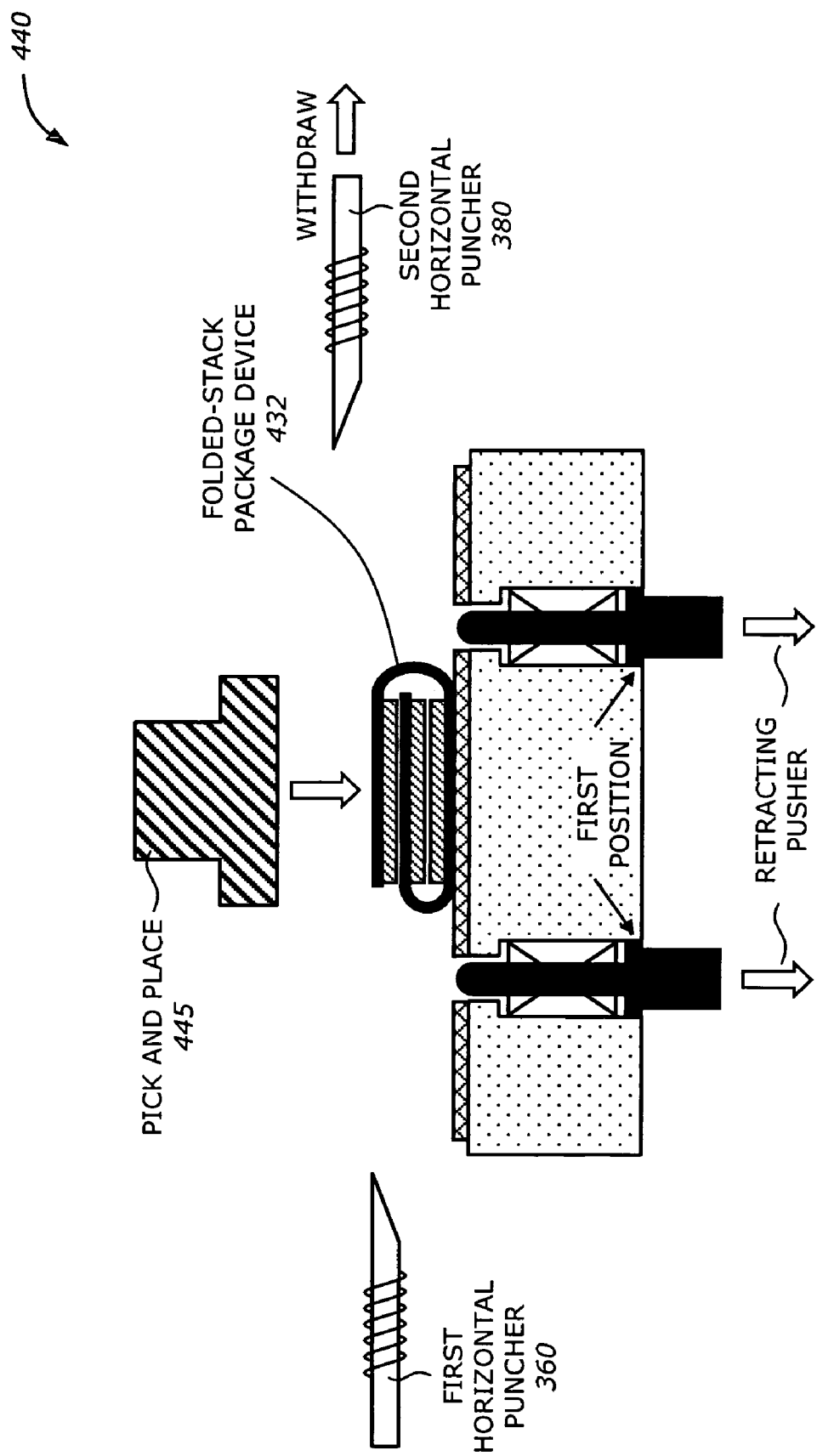
FIG. 4D is a diagram illustrating a fourth phase of the folding process according to one embodiment of the invention.

FIG. 4D is a diagram illustrating a fourth phase 440 of the folding process according to one embodiment of the invention.

In the fourth phase 440, the second horizontal puncher 380 finishes curing the adhesive and is retracted or withdrawn to its original position. A pick and place tool 445 picks up the folded stack packaged device 432 and places it to an off-load transport unit or a tray. The activation force on the pins 354 and 374 is removed so that the spring assemblies 356 and 376 exert a spring force on the pins 354 and 374 to push them back to the first position. The folding process is thus completed.

Figure 5:
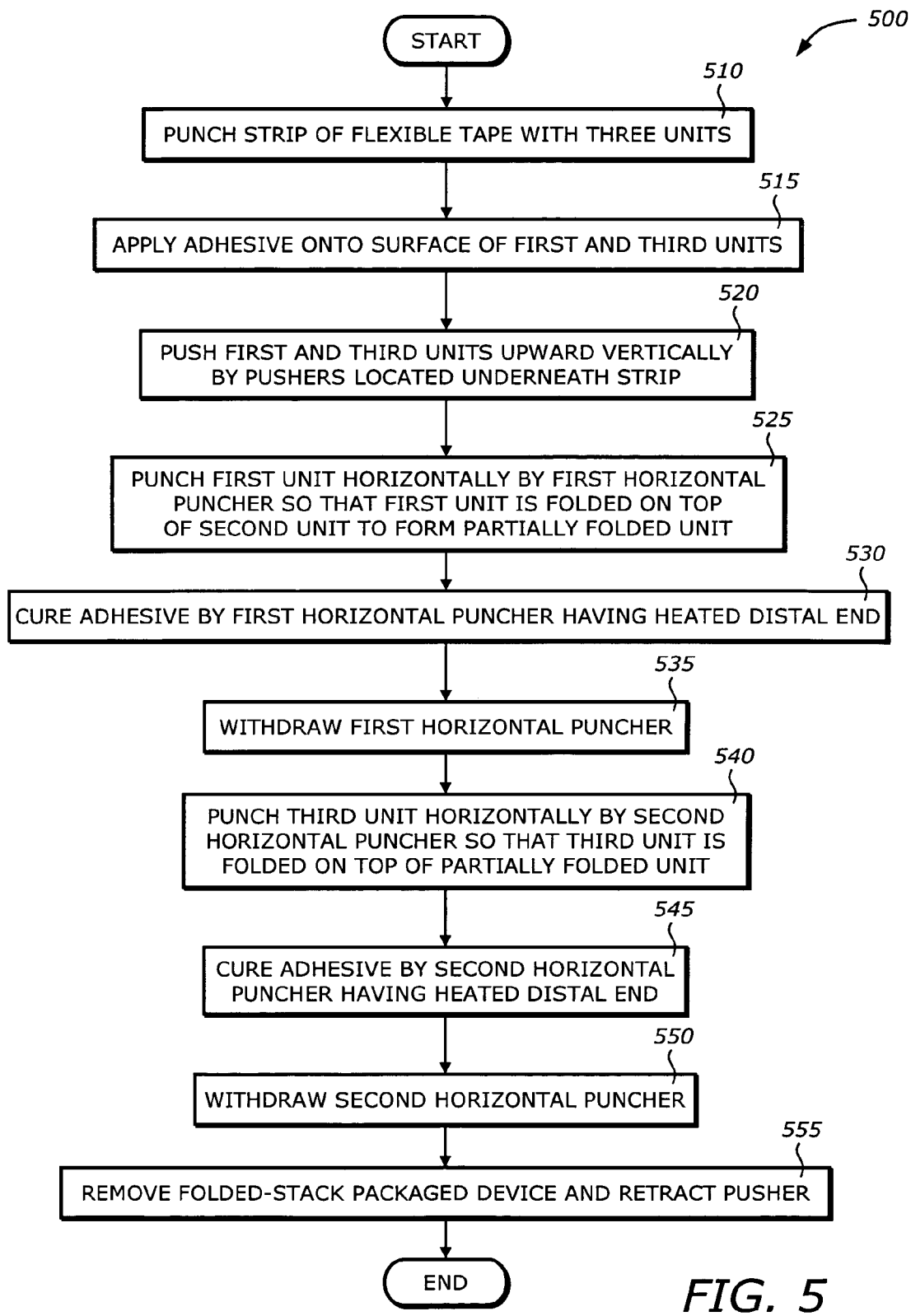
FIG. 5 is a flowchart illustrating an assembly process for folded-stack packaged devices according to one embodiment of the invention.

FIG. 5 is a flowchart illustrating an assembly process 500 for folded-stack packaged devices according to one embodiment of the invention.

Upon START, the process 500 punches out a strip of flexible tape with three units from the array of strips (Block 510). The first and third units are on the edges of the strip and the second unit is in the middle of the strip. Next, the process 500 applies adhesive on surface of the first and third units (Block 515). Then, the process 500 pushes the first and third units upward by pushers located underneath the strip (Block 520). This is accomplished by applying an activation force on the two pins of the pushers. The pins move from a first position to a second position.

Next, the process 500 punches the first unit horizontally by the first horizontal punch so that the first unit is folded on top of the second unit to form a partially folded unit (Block 525). Then, the process 500 cures the adhesive using the heated distal end of the first horizontal punch (Block 530). Next, the process 500 withdraws the first horizontal punch (Block 535).

Then, the process 500 punches the third unit horizontally by the second horizontal puncher so that the third unit is folded on top of the partially folded unit (Block 540). Next, the process 500 cures the adhesive on the third unit by the heated distal end of the second horizontal puncher (Block 545). Then, the process 500 withdraws the second horizontal puncher to its original position (Block 550).

Next, the process 500 removes the folded stack packaged device by a pick and place tool and retracts the pushers to their first position (Block 555). Then, the process 500 is terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    pushing a first unit upward vertically by a pusher located underneath a strip of flexible tape attached to the first unit and a sub-assembly, the first unit having a first die; and
    punching the first unit horizontally by a horizontal puncher so that the first unit is folded on top of the sub-assembly;
    wherein pushing comprises:
    activating a pin to move the pin from a first position to a second position, the pin pushing the first unit upward vertically; and
    springing the pin to return to the first position from the second position by a spring assembly.

2. The method of claim 1 wherein pushing the first unit comprises pushing the first die attached to a first portion of the strip.

3. The method of claim 2 further comprises attaching a second die to a second portion of the strip to form the sub-assembly.

4. The method of claim 2 further comprises forming the sub-assembly by a partially folded unit.

5. The method of claim 4 wherein forming the sub-assembly comprises:
    attaching a second unit to a second portion of the strip; and
    folding a third unit on top of the second unit, the third unit being attached to a third portion of the strip, the third unit being attached to the second unit via adhesive.

6. The method of claim 5 further comprising attaching a second die in the second unit to one of the second and third portions.

7. The method of claim 1 wherein one of the first unit and the sub-assembly includes a micro ball grid array (μBGA) packaged device.

8. A method comprising:
    pushing a first unit upward vertically by a pusher located underneath a strip of flexible tape attached to the first unit and a sub-assembly, the first unit having a first die; and
    punching the first unit horizontally by a horizontal puncher so that the first unit is folded on top of the sub-assembly; and
    dispensing one of the first unit and the sub-assembly with adhesive;
    wherein punching comprises heating a distal end of the horizontal puncher to cure the adhesive when the first unit is folded on top the sub-assembly.

9. The method of claim 8 wherein pushing the first unit comprises pushing the first die attached to a first portion of the strip.

10. The method of claim 9 further comprises attaching a second die to a second portion of the strip to form the sub-assembly.

11. The method of claim 9 further comprises forming the sub-assembly by a partially folded unit.

12. The method of claim 11 wherein forming the sub-assembly comprises:
    attaching a second unit to a second portion of the strip; and
    folding a third unit on top of the second unit, the third unit being attached to a third portion of the strip, the third unit being attached to the second unit via adhesive.

13. The method of claim 12 further comprising attaching a second die in the second unit to one of the second and third portions.

14. The method of claim 8 wherein one of the first unit and the sub-assembly includes a micro ball grid array (μBGA) packaged device.

* * * * *